United States Patent
Kim et al.

(10) Patent No.: US 11,557,641 B2
(45) Date of Patent: Jan. 17, 2023

(54) DISPLAY DEVICE

(71) Applicant: Samsung Display Co., LTD., Yongin-si (KR)

(72) Inventors: Byeong Beom Kim, Asan-si (KR); Min Ki Kim, Hwaseong-si (KR); Yu Ri Kim, Guri-si (KR); Woo Suk Seo, Yongin-si (KR); Hoi Kwan Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 288 days.

(21) Appl. No.: 17/060,771

(22) Filed: Oct. 1, 2020

(65) Prior Publication Data

US 2021/0265446 A1 Aug. 26, 2021

(30) Foreign Application Priority Data

Feb. 25, 2020 (KR) .................. 10-2020-0022761

(51) Int. Cl.
  *H01L 25/18* (2006.01)
  *H01L 27/32* (2006.01)
  *H01L 23/00* (2006.01)

(52) U.S. Cl.
  CPC .......... *H01L 27/3276* (2013.01); *H01L 24/03* (2013.01); *H01L 24/05* (2013.01);
  (Continued)

(58) Field of Classification Search
  CPC ..... H01L 2224/0383–05639; H01L 24/03–13; H01L 24/80; H01L 24/33
  See application file for complete search history.

(56) References Cited

U.S. PATENT DOCUMENTS

| 8,624,243 B2 * | 1/2014 | Koo ................ G02F 1/1345 349/40 |
| 8,907,327 B2 * | 12/2014 | Kim ................ H01L 27/124 257/40 |

(Continued)

FOREIGN PATENT DOCUMENTS

| KR | 10-2017-0080282 | 7/2017 |
| KR | 10-2017-0120478 | 10/2017 |

(Continued)

OTHER PUBLICATIONS

Extended European Search Report for European Patent Application or Patent No. 21156168.3 dated Jul. 7, 2021.

*Primary Examiner* — Hoa B Trinh
(74) *Attorney, Agent, or Firm* — Kile Park Reed & Houtteman PLLC

(57) ABSTRACT

A display device includes a display panel including panel pads adjacent to the side surface of a display panel; connection pads disposed on the side surface of the display panel and connected to the panel pads; and a circuit board disposed on the side surface of the display panel and including lead signal lines directly bonded to the connection pads, wherein the connection pads include a first connection pad, a second connection pad disposed on the first connection pad, and a third connection pad disposed on the second connection pad, and the first connection pad is in contact with corresponding one of the panel pads, and the third connection pad is directly bonded to corresponding one of the lead signal lines.

20 Claims, 16 Drawing Sheets

(52) U.S. Cl.
CPC .............. *H01L 24/08* (2013.01); *H01L 24/09* (2013.01); *H01L 24/80* (2013.01); *H01L 25/18* (2013.01); *H01L 2224/0383* (2013.01); *H01L 2224/03848* (2013.01); *H01L 2224/0568* (2013.01); *H01L 2224/05568* (2013.01); *H01L 2224/05583* (2013.01); *H01L 2224/05609* (2013.01); *H01L 2224/05611* (2013.01); *H01L 2224/05639* (2013.01); *H01L 2224/05647* (2013.01); *H01L 2224/05655* (2013.01); *H01L 2224/05666* (2013.01); *H01L 2224/05671* (2013.01); *H01L 2224/0807* (2013.01); *H01L 2224/08225* (2013.01); *H01L 2224/0915* (2013.01); *H01L 2224/80205* (2013.01)

(56) References Cited

U.S. PATENT DOCUMENTS

| | | | | |
|---|---|---|---|---|
| 9,190,459 | B2 * | 11/2015 | Jung | .................... H01L 51/5237 |
| 9,871,899 | B2 * | 1/2018 | Kim | .................... H04M 1/0268 |
| 2018/0315776 | A1 | 11/2018 | Chuang et al. | |
| 2020/0004093 | A1 | 1/2020 | Yoo et al. | |

FOREIGN PATENT DOCUMENTS

| | | |
|---|---|---|
| KR | 10-2017-0139217 | 12/2017 |
| KR | 10-2018-0024099 | 3/2018 |
| KR | 10-2018-0070774 | 6/2018 |
| KR | 10-2019-0071026 | 6/2019 |
| KR | 10-2019-0079749 | 7/2019 |
| WO | 2020/032340 | 2/2020 |

\* cited by examiner

DISPLAY DEVICE

CROSS-REFERENCE TO RELATED APPLICATION(S)

This application claims priority to and benefits of Korean Patent Application No. 10-2020-0022761 under 35 U.S.C. § 119, filed in the Korean Intellectual Property Office on Feb. 25, 2020, the entire contents of which are incorporated herein by reference.

BACKGROUND

1. Technical Field

The invention relates to a display device.

2. Description of the Related Art

The importance of display devices has increased with the development of multimedia. Accordingly, various types of display devices, such as organic light emitting displays (OLEDs) and liquid crystal displays (LCDs), have been used. Such display devices have been diversified in application examples based on various mobile electronic appliances, for example, portable electronic appliances such as smart phones, smart watches, and tablet PCs.

A display device may include a substrate divided into a display area and a non-display area. In the display area, pixels may be disposed on the substrate, and in the non-display area, pads and the like may be disposed on the substrate. A flexible film (COF film) or the like equipped with a driving circuit may be coupled to the pads to transmit driving signals to the pixels. In order to reduce the non-display area of the display device, the flexible film may be attached to the side surface of the substrate.

The flexible film may include leads coupled to the pads, and each of the leads may be bonded to the pads separated from each other. The bonding of the leads to the pads may be conducted by an anisotropic conductive film or may be conducted by an ultrasonic bonding process in which the pads contact (e.g., directly contact) the leads.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

According to an aspect, a display device may be provided in which adhesion between a display panel and a flexible film attached to the side surface of the display panel may be improved.

However, aspects of the invention are not restricted to the one set forth herein. The above and other aspects of the invention will become more apparent to one of ordinary skill in the art to which the invention pertains by referencing the detailed description of the invention given below.

An embodiment of a display device may include a display panel including panel pads adjacent to a side surface of the display panel, connection pads disposed on the side surface of the display panel and connected to the panel pads, and a circuit board disposed on the side surface of the display panel, the circuit board including lead signal lines directly bonded to the connection pads. The connection pads may include a first connection pad, a second connection pad disposed on the first connection pad, and a third connection pad disposed on the second connection pad, the first connection pad may be in contact with corresponding one of the panel pads, and the third connection pad may be directly bonded to corresponding one of the lead signal lines.

The third connection pad may be ultrasonically bonded to the corresponding one of the lead signal lines.

An interface between the third connection pad and the corresponding one of the lead signal lines may have a non-flat shape.

A melting point of the third connection pad may be lower than a melting point of the second connection pad and a melting point of the first connection pad.

The melting point of the third connection pad may be about 270° C. or lower.

The third connection pad may have a thickness smaller than or equal to a half of an interval between neighboring second connection pads.

The thickness of the third connection pad may be equal to or greater than about 1 μm.

The display panel may include a substrate, and an end of the panel pad may be aligned with a side surface of the substrate.

The connection pad may protrude outward from the side surface of the substrate.

Another embodiment of a display device including a display area and a non-display area surrounding the display area may include a display panel including a pad area disposed on a side surface of the non-display area, a connection pad disposed on the pad area, and a circuit board disposed on the connection pad. The display panel may include at least one panel pad adjacent to the pad area, the connection pad may be connected to the at least one panel pad, and the circuit board may include a lead signal line directly bonded to the connection pad. The connection pad may include a first connection pad, a second connection pad disposed on the first connection pad, and a third connection pad disposed on the second connection pad. The first connection pad may be in contact with the at least one panel pad, and the third connection pad may be directly bonded to the lead signal line.

The connection pad may be ultrasonically bonded to the lead signal line.

An interface between the connection pad and the lead signal line may have a non-flat shape.

The connection pad may include a first material selected from nickel (Ni), chromium (Cr), copper (Cu), indium (In), tin (Sn), silver (Ag), titanium (Ti), molybdenum (Mo), or any combination thereof The first material may include at least one selected from NiCr/Cu/InSnAg, Ti/Cu/InSnAg, and MoTi/Cu/InSnAg.

The lead signal line may include a second material including Sn.

The first material and the second material may be mixed in an area between the connection pad and the lead signal line.

A melting point of the third connection pad may be lower than a melting point of the second connection pad and a melting point of the first connection pad.

The third connection pad may have a thickness smaller than or equal to a half of an interval between neighboring second connection pads.

The display panel may include a substrate, a first conductive layer on the substrate, a first insulating layer on the first conductive layer, a second conductive layer on the first insulating layer, a second insulating layer on the second conductive layer, and a third conductive layer on the second insulating layer. The third conductive layer may include the at least one panel pad.

The connection pad may protrude outward from a side surface of the substrate.

BRIEF DESCRIPTION OF THE DRAWINGS

The above and other aspects and features of the invention will become more apparent by describing in detail embodiments thereof with reference to the attached drawings, in which.

DETAILED DESCRIPTION OF THE EMBODIMENTS

Figure 1:
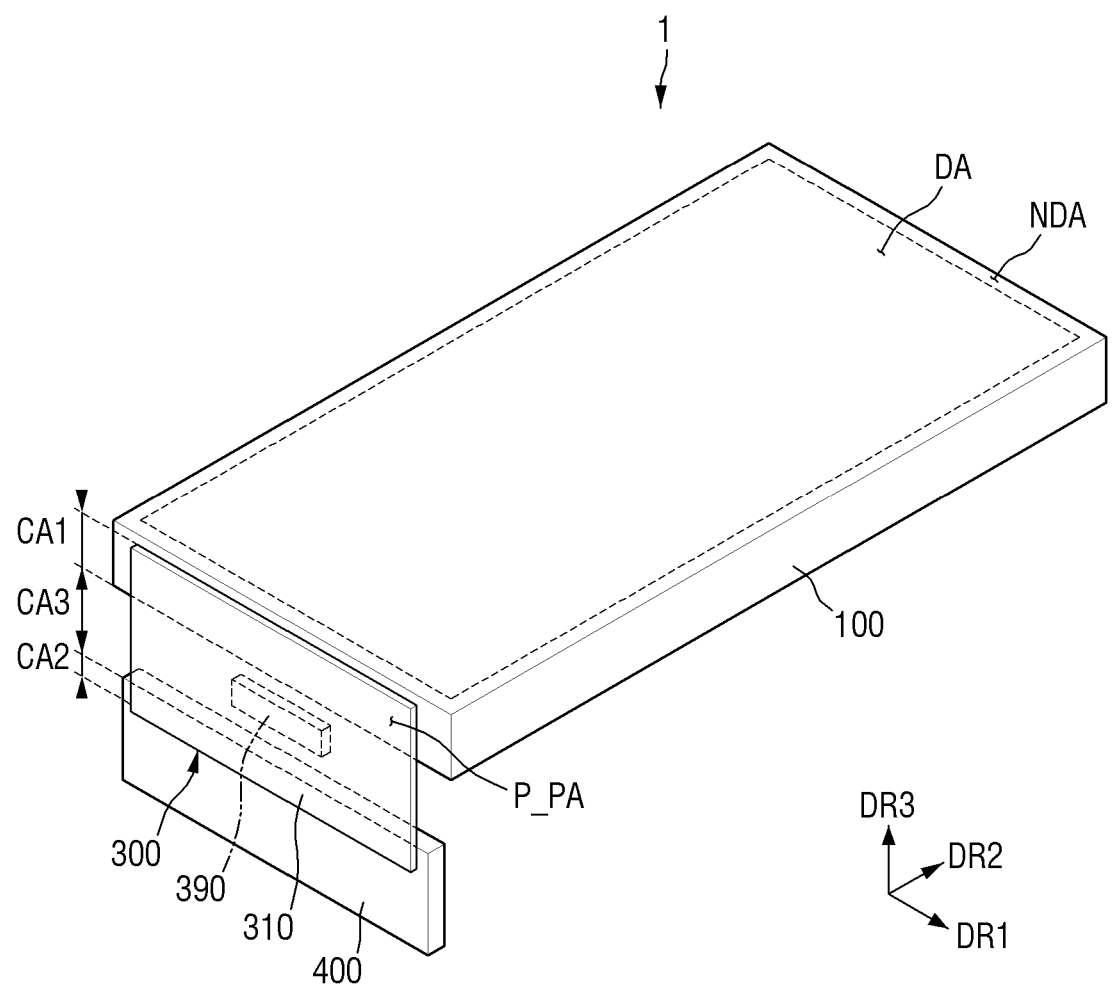
FIG. 1 is a schematic perspective view of a display device according to an embodiment.

The invention will now be described more fully hereinafter with reference to the accompanying drawings, in which embodiments of the invention are shown using like reference characters for like elements. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Spatially relative terms, such as "beneath," "below," "lower," "above," "upper" and the like, may be used herein for ease of description to describe one element's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein should be interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within±30%, 20%, 5% of the stated value.

The term overlap may include layer, stack, face or facing, extending over, extending under, covering or partly covering or any other suitable term as would be appreciated and understood by those of ordinary skill in the art.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
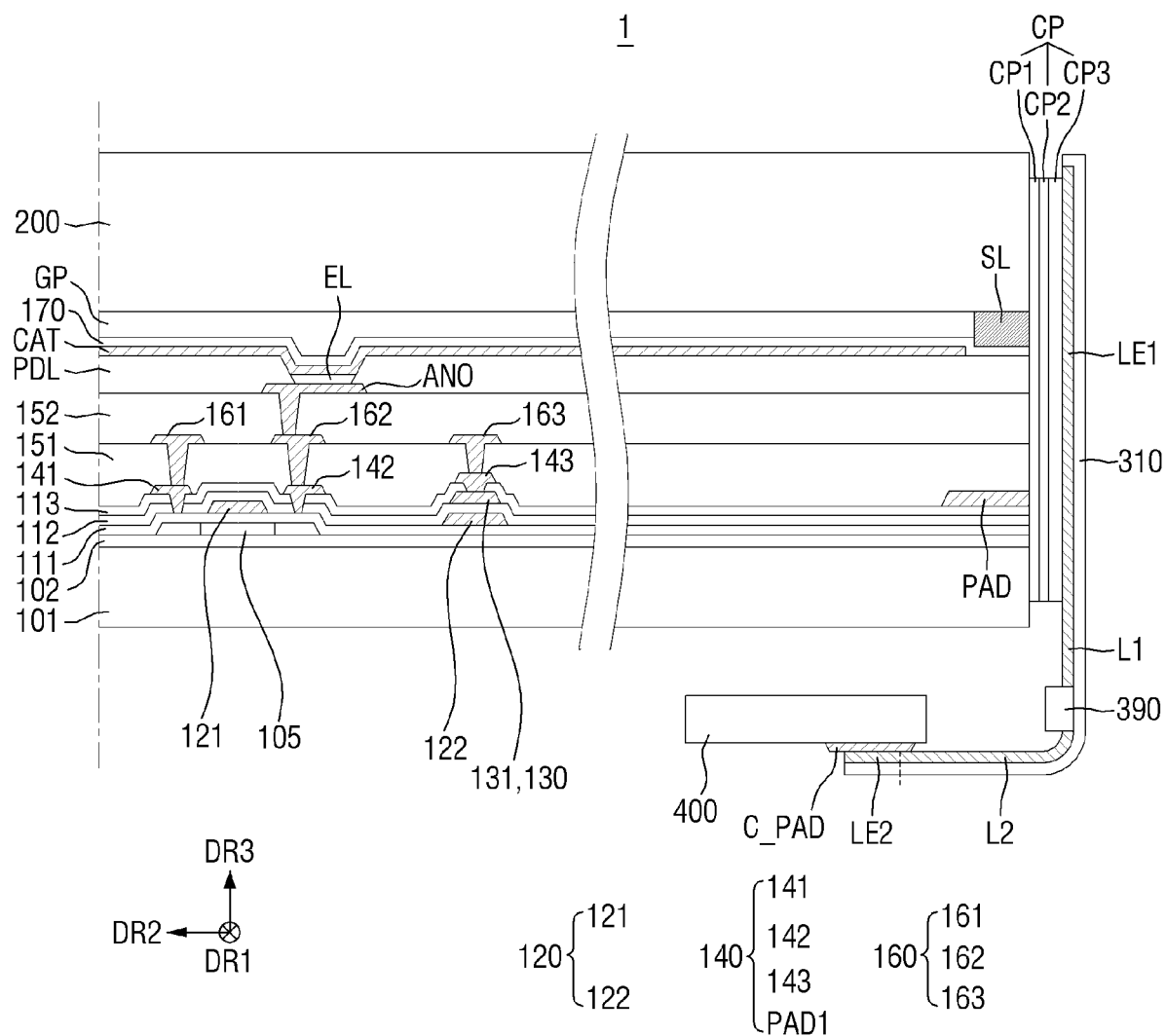
FIG. 2 is a schematic cross-sectional view of the display device of FIG. 1.
Figure 3:
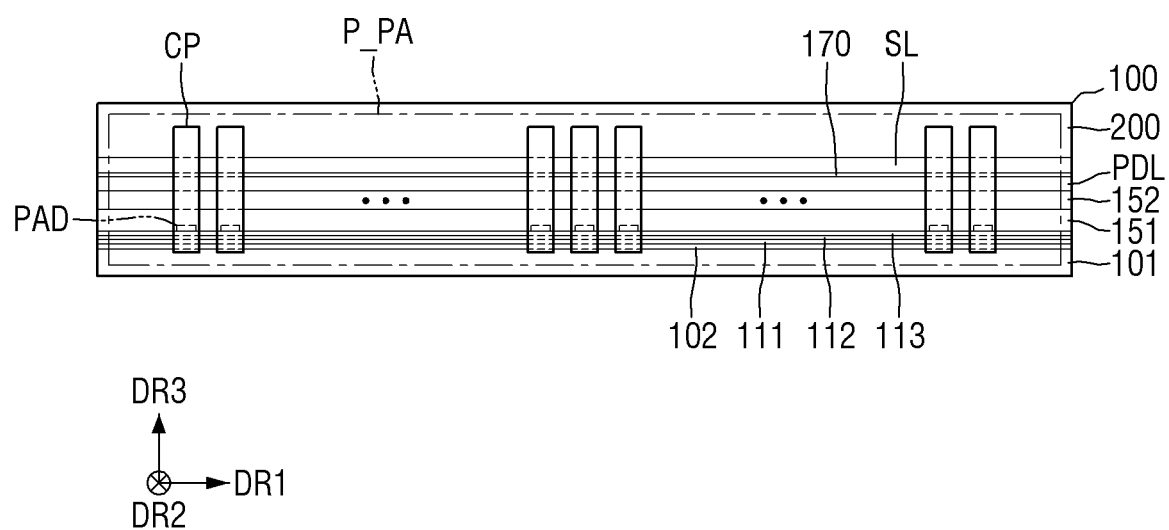
FIG. 3 is a schematic plan view of a panel pad area of a display device according to an embodiment.
Figure 4:
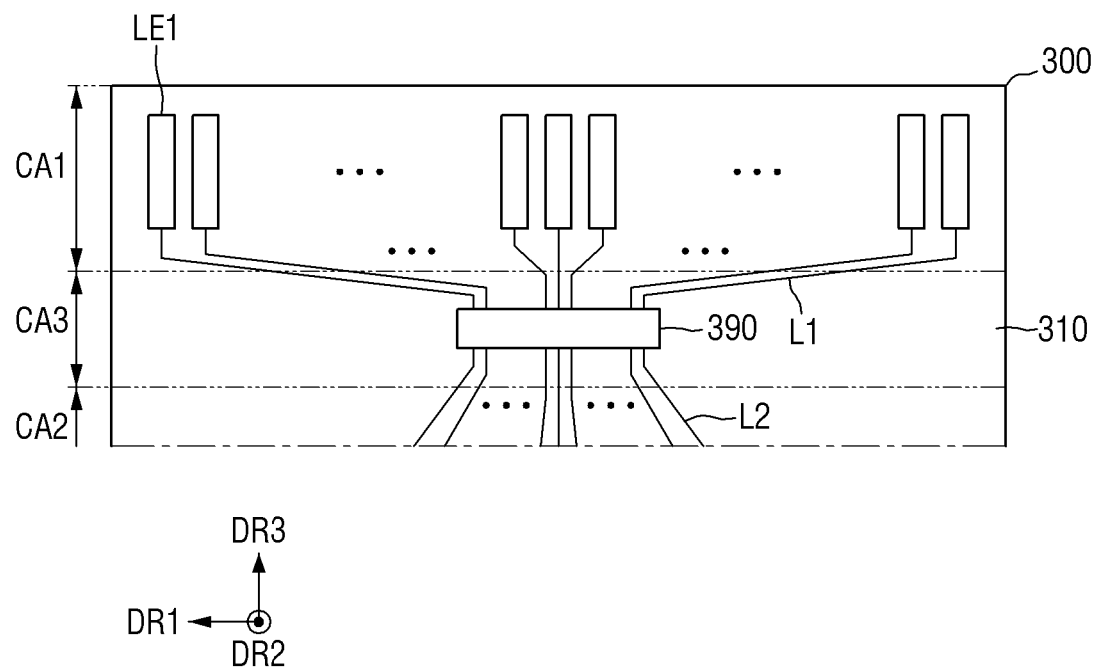
FIG. 4 is a schematic plan view of a first circuit board according to an embodiment.
Figure 5:
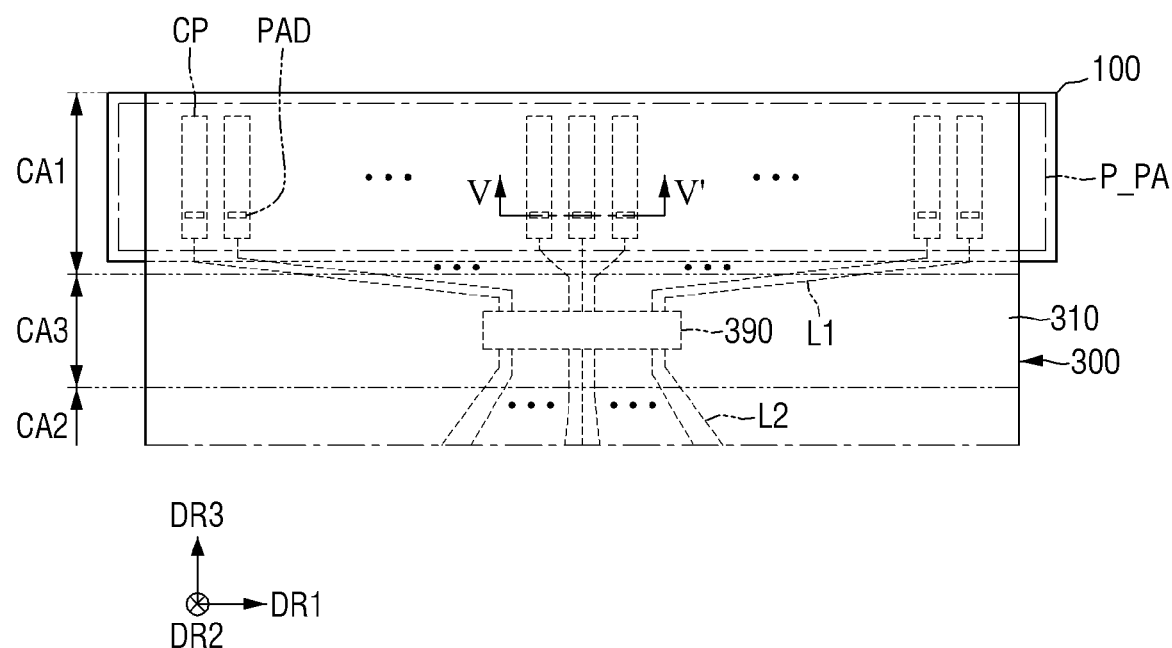
FIG. 5 is a schematic plan view of a display device having a first circuit board attached to a panel pad area of a display panel.

FIG. 1 is a schematic perspective view of a display device according to an embodiment. FIG. 2 is a schematic cross-sectional view of the display device of FIG. 1. FIG. 3 is a schematic plan view of a panel pad area of a display device according to an embodiment. FIG. 4 is a schematic plan view of a first circuit board according to an embodiment. FIG. 5 is a schematic plan view of a display device having a first circuit board attached to a panel pad area of a display panel.

Referring to FIGS. 1 to 5, a display device 1, which may be a device for displaying a moving image or a still image, may be used as a display screen of various products such as televisions, notebooks, monitors, billboards, internet of things (IOTs) as well as portable electronic appliances such as mobile phones, smart phones, tablet personal computers (tablet PCs), smart watches, watch phones, mobile communication terminals, electronic notebooks, electronic books, portable multimedia players (PMPs), navigators, and ultra mobile PCs (UMPCs).

The display device 1 may include a display panel 100 for displaying an image, a first circuit board 300 connected to the display panel 100, and a second circuit board 400 connected to the first circuit board 300.

The display panel 100 may be a light emitting display panel including a light emitting element. For example, the display panel 100 may be an organic light emitting display panel using an organic light emitting diode, a micro light emitting display panel using a micro light emitting diode (LED), or a quantum dot light emitting display panel including a quantum dot light emitting layer. In the following embodiments, a case where an organic light emitting display panel may be applied as the display panel 100 is illustrated, but the invention is not limited thereto, and different kinds of display panels such as a liquid crystal display (LCD) panel, a quantum dot organic light emitting display (QD-OLED) panel, a quantum dot liquid crystal display (QD-LCD) panel, or a micro LED panel may be applied. Hereinafter, a case where the display panel 100 may be an organic light emitting display panel will be described.

The display panel 100 may include a display area DA including pixels and a non-display area NDA disposed adjacent to (e.g., around) the display area DA. The display area DA may have a rectangular shape having vertical corners or a rectangular shape having rounded corners in a plan view. The display area DA may have short sides and long sides. The short side of the display area DA may be a side extending in the first direction DR1. The long side of the display area DA may be a side extending in the second direction DR2. However, the planar shape of the display area DA is not limited to a rectangle, and may have a circular shape, an elliptical shape, or other various shapes. The non-display area NDA may be disposed adjacent to both short sides and long sides of the display area DA. The non-display area NDA may surround all sides of the display area DA and may form a border of the display area DA. However, the invention is not limited thereto, and the non-display area NDA may be disposed, e.g., adjacent to both short sides or both long sides of the display area DA.

The display panel 100 may further include a panel pad area P_PA disposed on at least one side surface of the display panel 100. For example, the panel pad area P_PA may be disposed on a side surface adjacent to the short side of the display area DA, but the invention is not limited thereto. The panel pad area P_PA may be disposed on a side surface adjacent to the long side of the display area DA or may be disposed on a side surface adjacent to each of the short side or long side of the display area DA.

The first circuit board 300 may be attached onto the panel pad area P_PA of the display panel 100. The bonding between the panel pad area P_PA of the display panel 100 and the first circuit board 300 may be conducted through an anisotropic conductive film, or may be conducted by an ultrasonic bonding process in which a connection pad CP and a first lead signal line LE1 directly surface-contact each other. Details thereof will be described later.

In the case of side bonding in which the first circuit board 300 may be attached to a side surface of the display panel 100, in the display panel 100, the width of the area, to which the first circuit board 300 may be attached, in the second direction DR2 may be reduced so as to reduce a bezel area. In case that such side bonding may be applied to a tiled display device, the boundary between the display panels 100 may be reduced, so that the aperture ratio and image quality of the display device 1 may be improved.

The first circuit board 300 may include a printing base film 310. The printing base film 310 may be made of an insulating material.

The first circuit board 300 may include a first circuit area CA1, a side of which may be attached to the panel pad area P_PA of the display panel 100, a second circuit area CA2 located at another side of the first circuit area CA1 in the third direction DR3 and attached to a second circuit board 400, and a third circuit area CA3 located between the first circuit area CA1 and the second circuit area CA2. The first circuit area CA1 may overlap the panel pad area P_PA in the second direction DR2. The second circuit area CA2 may overlap a circuit pad terminal C_PAD of a second circuit board 400 to be described later in the third direction DR3.

The first circuit board 300 may further include a driving integrated circuit 390 disposed in the third circuit area CA3 of the first circuit board 300. The driving integrated circuit 390 may be implemented as a data driving chip, and a chip on film (COF) attached to the display panel through the first circuit board 300 may be applied.

The first circuit board 300 may further include a first lead signal line LE1 disposed in the first circuit area CA1 and a second lead signal line LE2 disposed in the second circuit area CA2. The first lead signal line LE1 may be electrically connected to the driving integrated circuit 390 by the first signal line L1. The first signal line L1 may be disposed over the first circuit area CA1 and the third circuit area CA3. The second lead signal line LE2 may be electrically connected to the driving integrated circuit 390 by the second signal line L2. The second signal line L2 may be disposed over the second circuit area CA2 and the third circuit area CA3. Each of the first lead signal line LE1 and the second lead signal line LE2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and tin (Sn). Each of the first lead signal line LE1 and the second lead signal line LE2 may be formed of a single layer including the above-described materials, but the invention is not limited thereto, and may be formed of a laminated structure. For example, each of the first lead signal line LE1 and the second lead signal line LE2 may be made of a metal including tin (Sn), but the material thereof is not limited thereto.

The second circuit board 400 may be attached to the second circuit area CA2 of the first circuit board 300. Although it is shown in the drawings that the second circuit board 400 may be disposed on another surface of the first circuit board 300, the invention is not limited thereto, and the second circuit board 400 may be disposed on a surface of the first circuit board 300. The second circuit board 400 may include a circuit pad terminal C_PAD attached to the second circuit area CA2 of the first circuit board 300. The circuit pad terminal C_PAD of the second circuit board 400 may be electrically connected to second lead signal lines LE2 disposed in the second circuit area CA2 of the first circuit board 300. The bonding between the first circuit board 300 and the second circuit board 400 may be conducted through an anisotropic conductive film, or may be conducted by an ultrasonic bonding process in which the circuit pad terminal C_PAD and the second lead signal line LE2 surface-contact (e.g., directly surface-contact) each other.

Referring to FIG. 2, the display panel 100 may include a base substrate 101, conductive layers, insulating layers insulating the conductive layers, and an organic light emitting layer EL.

The base substrate 101 may be disposed over the display area DA and the non-display area NDA. The base substrate 101 may function to support various elements disposed thereon. In an embodiment, the base substrate 101 may be a rigid substrate including a rigid material such as soft glass or quartz, or a combination thereof. However, the invention is not limited thereto, and the base substrate 101 may be a flexible substrate including a flexible material such as polyimide (PI).

A buffer layer 102 may be disposed on the base substrate 101. The buffer layer 102 may prevent the penetration of moisture and oxygen from the outside through the base substrate 101. The buffer layer 102 may include any of a silicon nitride (SiNx) film, a silicon oxide (SiO$_2$) film, and a silicon oxynitride (SiOxNy) film.

A semiconductor layer 105 may be disposed on the buffer layer 102. The semiconductor layer 105 may form a channel of a thin film transistor. The semiconductor layer 105 may be disposed in each pixel of the display area DA, and in some cases, may be also disposed in the non-display area NDA. The semiconductor layer 105 may include a source/drain region and an active region. The semiconductor layer 105 may include polycrystalline silicon.

A first insulating layer 111 may be disposed on the semiconductor layer 105. The first insulating layer 111 may be disposed over the entire surface of the base substrate 101. The first insulating layer 111 may be a gate insulating layer having a gate insulating function. The first insulating layer 111 may include a silicon compound, a metal oxide, or the like, or a combination thereof. For example, the first insulating layer 111 may include silicon oxide, silicon nitride, silicon oxynitride, aluminum oxide, tantalum oxide, hafnium oxide, zirconium oxide, titanium oxide, or the like. These compounds may be used alone or in combination with each other.

A first conductive layer 120 may be disposed on the first insulating layer 111. In an embodiment, the first conductive layer 120 may include a gate electrode 121 of a thin film transistor TFT and a first electrode 122 of a storage capacitor Cst. The first conductive layer 120 may include a metal material. The first conductive layer 120 may include at least one metal selected from molybdenum (Mo), aluminum (Al), platinum (Pt), palladium (Pd), silver (Ag), magnesium (Mg), gold (Au), nickel (Ni), neodymium, (Nd), iridium (Ir), chromium (Cr), calcium (Ca), titanium (Ti), tantalum (Ta), tungsten (W), and copper (Cu). The first conductive layer 120 may be a single film or laminated film made of the above-described materials.

A second insulating layer 112 may be disposed on the first conductive layer 120. The second insulating layer 112 may insulate the first conductive layer 120 and the second conductive layer 130. The material of the second insulating layer 112 may be selected from the exemplified materials of the first insulating layer 111.

The second conductive layer 130 may be disposed on the second insulating layer 112. The second conductive layer 130 may include a second electrode 131 of the storage capacitor Cst. The material of the second conductive layer 130 may be selected from the exemplified materials of the first conductive layer 120. The first electrode 122 of the storage capacitor Cst and the second electrode 131 of the storage capacitor Cst may form a capacitor through the second insulating layer 112.

A third insulating layer 113 may be disposed on the second conductive layer 130. The third insulating layer 113 may include the exemplified material of the first insulating layer 111.

A third conductive layer 140 may be disposed on the third insulating layer 113. The third conductive layer 140 may include a source electrode 141, a drain electrode 142, a power voltage electrode 143, and the panel pads PAD.

The third conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 140 may be a single film made of the exemplified materials. However, the invention is not limited thereto, and the third conductive layer 140 may be a laminated film. For example, the third conductive layer 140 may be formed as a stacked structure of Ti/Al/Ti, Mo/Al/Mo, Mo/AlGe/Mo, or Ti/Cu.

The first conductive layer 120 may further include connection lines (not shown) respectively corresponding to the panel pads PAD in the thickness direction. The connection lines (not shown) may be disposed to overlap each of the panel pads in the thickness direction. The width of each of the connection lines in the first direction DR1 may be smaller than the width of each of the panel pads in the first direction DR1, but the invention is not limited thereto.

Although not shown, the above-described second insulating layer 112 may be disposed between the panel pad PAD and each of the connection lines. Each of the panel pads PAD and each of the connection lines may be in electrical contact with each other through at least one contact hole of the second insulating layer 112. Although not shown, each of the connection lines may be electrically connected to a thin film transistor of each pixel in the display area DA.

The panel pad PAD may include an upper surface contacting a first via layer 151, a lower surface contacting the third insulating layer 113, and a side surface to which the first circuit board 300 may be attached. A side surface of the panel pad PAD may be a surface exposed to the outside. The first circuit board 300 may be ultrasonically bonded onto a side surface of the panel pad PAD. For example, a side surface of the panel pad PAD may be an ultrasonic bonding surface where ultrasonic bonding occurs. The panel pad PAD may be electrically connected to the first lead signal line LE1 of the first circuit board 300 through the above ultrasonic bonding. Specifically, the ultrasonic bonding may be performed by partially melting the connection pad CP and the first lead signal line LE1 disposed between a side surface of the panel pad PAD and the first lead signal line LE1. Details of the ultrasonic bonding will be described later with reference to FIGS. 6 to 8.

A side surface of the panel pad PAD may be perpendicular to the upper and lower surfaces of the panel pad PAD, but the invention is not limited thereto. A side surface of the panel pad PAD may be parallel to a surface of the connection pad CP, and may be parallel to a surface of the first lead signal line LE1. The upper surface of the panel pad PAD may be perpendicular to a surface of the connection pad CP, and may be perpendicular to a surface of the first lead signal line LE1. The lower surface of the panel pad PAD may be perpendicular to a surface of the connection pad CP, and may be perpendicular to a surface of the first lead signal line LE1, but the invention is not limited thereto.

The end of the panel pad PAD may be aligned with a side surface of the base substrate 101 and a side surface of an encapsulation substrate 200. The panel pad PAD may not protrude from a side surface of the base substrate 101. A side surface of the panel pad PAD may contact a surface of the connection pad CP.

As described above, the panel pad PAD may be included in the third conductive layer 140. For example, the panel pad PAD may be formed together with the source electrode 141, the drain electrode 142 and the power voltage electrode 143. For example, the third conductive layer 140 may be thicker than another conductive layer in order to increase the area of a side surface of the panel pad PAD contacting the connection pad CP. For example, the third conductive layer 140 may be thicker than each of the first conductive layer 120, the second conductive layer 130, and the fourth conductive layer 160. However, the invention is not limited thereto, and the panel pad PAD may be included in another conductive layer. For example, the panel pad PAD may be included in the first conductive layer 120, the second conductive layer 130, or the fourth conductive layer 160. Further, the panel pad PAD may include sub-panel pads (not shown) formed on two or more conductive layers selected from the first to fourth conductive layers 120, 130, 140, and 160, and may have a form in which the sub-panel pads (not shown) may be connected to each other through a contact hole.

The first via layer 151 may be disposed on the third conductive layer 140. Another side surface of the first via layer 151 in the second direction DR2 may be partially covered by the connection pad CP. The first via layer 151 may include an organic insulating material such as polyacrylate resin, epoxy resin, phenolic resin, polyamide resin, polyimide resin, unsaturated polyester resin, polyphenylene ether resin, polyphenylene sulfide resin, benzocyclobutene (BCB), or a combination thereof A fourth conductive layer 160 may be disposed on the first via layer 151. The fourth conductive layer 160 may include first and second power voltage lines 161 and 163 and a connection electrode 162. The first power voltage line 161 may be electrically connected to the source electrode 141 of the thin film transistor TFT through a contact hole penetrating the first via layer 151. The connection electrode 162 may be electrically connected to the drain electrode 142 of the thin film transistor TFT through a contact hole penetrating the first via layer 151. The second power voltage line 163 may be electrically connected to the power voltage electrode 143 through a contact hole penetrating the first via layer 151.

The fourth conductive layer 160 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single film. However, the invention is not limited thereto, and the fourth conductive layer 160 may be a laminated film. For example, the fourth conductive layer 160 may be formed as a stacked structure of Ti/Al/Ti, Mo/Al/Mo, Mo/AlGe/Mo, or Ti/Cu.

A second via layer 152 may be disposed on the fourth conductive layer 160. The second via layer 152 may include the exemplified materials of the first via layer 151. The second via layer 152 may include an organic insulating material such as polyacrylate resin, epoxy resin, phenolic resin, polyamide resin, polyimide resin, unsaturated polyester resin, polyphenylene ether resin, polyphenylene sulfide resin, benzocyclobutene (BCB), or a combination thereof An anode electrode ANO may be disposed on the second via layer 152. The anode electrode ANO may be electrically connected to the connection electrode 162 through a contact hole penetrating the second via layer 152.

A pixel defining layer PDL may be disposed on the anode electrode ANO. The pixel defining layer PDL may include an opening exposing the anode electrode ANO. The pixel defining layer PDL may be formed of an organic insulating material or an inorganic insulating material. In an embodiment, the pixel defining layer PDL may include a material such as a photoresist, a polyimide resin, an acrylic resin, a silicon compound, a polyacrylic resin, or a combination thereof.

The organic light emitting layer EL may be disposed on the anode electrode ANO and in the opening of the pixel defining layer PDL. A cathode electrode CAT may be disposed on the organic light emitting layer EL and the pixel defining layer PDL. The cathode electrode CAT may be a common electrode disposed over multiple pixels.

A capping layer 170 may be disposed on the cathode electrode CAT. The capping layer 170 may cover the cathode electrode CAT. The capping layer 170 may be a laminated film in which inorganic films and organic films may be alternately laminated, but the invention is not limited thereto.

The end of the cathode electrode CAT may be terminated to be spaced apart from a side surface of the display panel 100 by a predetermined distance. The end of the cathode electrode CAT may be covered by the capping layer 170. Therefore, the cathode electrode CAT and the connection pad CP may be insulated from each other.

An encapsulation substrate 200 may be disposed on the capping layer 170. The encapsulation substrate 200 may be a transparent substrate. The encapsulation substrate 200 may include a glass substrate. The encapsulation substrate 200 may be spaced apart from the capping layer 170 with a predetermined space GP.

The base substrate 101 to the capping layer 170 may be defined as a lower display substrate. A sealant SL may couple the lower display substrate and the encapsulation substrate 200. The sealant SL may be disposed along the edge of the encapsulation substrate 200. Another side surface of the sealant SL in the second direction DR2 may be aligned with the base substrate 101 and the encapsulation substrate 200. Another end of the sealant SL in the second direction DR2 may be in contact with a side of the second direction DR2 of the connection pad CP.

The sealant SL may form a space GP between the lower display substrate and the encapsulation substrate 200. The space GP may be filled with air or inert gases. The encapsulation substrate 200 and the sealant SL may prevent moisture from permeating into the lower display substrate. The sealant SL may include an inorganic adhesive member such as frits, but the invention is not limited thereto, and the sealant SL may include an organic adhesive member.

As described above, the first circuit board 300 may be disposed on the panel pad area P_PA of the side surface of the display panel 100. An end of the first circuit board 300 may be attached to the panel pad area P_PA and bent to cover a side surface of the base substrate 101, and another end of the first circuit board 300 may be disposed to be spaced apart from the lower surface of the base substrate 101. As described above, the first circuit board 300 may include a base film 310 and various elements disposed on a surface of the base film 310. Another end of the first circuit board 300 may be connected to the second circuit board 400.

A connection pad CP may be disposed between a surface of the display panel 100 and the first circuit board 300. The connection pad CP may be disposed in a line type extending in the third direction DR3 over a side surface of the encapsulation substrate 200 to a side surface of the base substrate 101. For example, an end of the connection pad CP may be disposed on a side surface of the encapsulation substrate 200, and another end thereof may be disposed on a side surface of the base substrate 101. Further, the connection pad CP may have a shape protruding outward from a side surface of the display panel 100. For example, the connection pad CP may have a shape protruding outward from a side surface of the encapsulation substrate 200 and a side surface of the base substrate 101.

The connection pad CP may electrically connect the panel pad PAD and the first lead signal line LE1. A side of the connection pad CP may be attached to the first lead signal line LE1 of the first circuit board 300. Although it is shown that the connection pad CP and the first lead signal line LE1 have the same planar shape, the invention is not limited thereto, and the connection pad CP and the first lead signal line LE1 may have different planar shapes from each other. In an embodiment, the connection pad CP and the first lead signal line LE1 may each correspond one-to-one and may have the same arrangement. In another embodiment, the connection pad CP may include a dummy connection pad (not shown) that may not be ultrasonically bonded to the first lead signal line LE1. The number of connection pads CP may be greater than the number of first lead signal lines LE1. In another embodiment, the first lead signal line LE1 may include a first dummy lead signal wire (not shown) that may not be ultrasonically bonded to the connection pad CP. The number of first lead signal lines LE1 may be greater than the number of connection pads CP.

The connection pad may have a laminated structure including a first connection pad CP1 contacting the side surface of the display panel 100, a third connection pad CP3 contacting the first circuit board 300, and a second connection pad CP2 disposed between the first connection pad CP1 and the third connection pad CP3. The side surfaces of the first to third connection pads CP1 to CP3 may be generally aligned, but the invention is not limited thereto, and the side surfaces thereof may not be aligned by melting at least a part of the connection pad CP through a laser patterning process or an ultrasonic bonding process to be described later.

The interface between the first and second connection pads CP1 and CP2 and the interface between the second and third connection pads CP2 and CP3 may be flat. A side surface of the first connection pad CP1 contacting the display panel 100 in the second direction DR2 may include a flat surface. Another side surface of the third connection pad CP3 contacting the first circuit board 300 in the second direction DR2 may include a non-flat surface.

In an embodiment, the third connection pad CP3 may have the same shape as the first and second connection pads CP1 and CP2. the side surfaces of the first to third connection pads CP1, CP2, and CP3 may be aligned. In another embodiment, the third connection pad CP3 may cover a side of the second connection pad CP2, facing the third connection pad CP3, and the side surfaces of the first and second connection pads CP1 and CP2. The edge of the third connection pad CP3 may be disposed outside the edges of the first and second connection pads CP1 and CP2. The edge of the connection pad CP may be defined by the edge of the third connection pad CP3, and the width of the connection pad CP may also be defined by the width of the third connection pad CP3.

The first connection pad CP1 may be disposed on the panel pad area P_PA of the side surface of the display panel 100. The first connection pad CP1 may improve bonding force between the second connection pad CP2 and the side surface of the display panel 100. The first connection pad CP1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). For example, the first connection pad CP1 may include at least one of nickel (Ni), chromium (Cr), molybdenum (Mo), and titanium (Ti), but the material thereof is not limited thereto.

The second connection pad CP2 may be disposed on the first connection pad CP1. The second connection pad CP2 may have the highest electrical conductivity among the first to third connection pads CP1 to CP3, and thus may play a main role in electrically connecting the panel pad PAD of the display panel 100 and the first lead signal line LE1 of the first circuit board 300. The material of the second connection pad CP2 may be selected from the exemplified materials of the first connection pad CP1. For example, the second connection pad CP2 may be made of a metal including copper (Cu), but the material thereof is not limited thereto.

The third connection pad CP3 may be disposed on the second connection pad CP2. The third connection pad CP3 may be disposed between the second connection pad CP2 and the first circuit board 300. The third connection pad CP3 may have a shape corresponding to the shape of the first lead signal line LE1 of the first circuit board 300. The third connection pad CP3 may be partially melted by ultrasonic waves during an ultrasonic bonding process to bond the first circuit board 300 to the side surface of the display panel 100. Therefore, the third connection pad CP3 may include a low-melting metal having a low melting point so as to be partially melted by ultrasonic waves, but the material thereof is not limited thereto. The melting point of the metal included in the third connection pad CP3 may be lower than the melting point of the metal included in the first and second connection pads CP1 and CP2. For example, the melting point of the metal included in the third connection pad CP3 may be about 270° C. or lower, but is not limited thereto. The third connection pad CP3 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). For example, the third connection pad CP3 may include at least one of Indium (In), tin (Sn), and silver (Ag). The connection pad CP may include a structure selected from NiCr/Cu/InSnAg, Ti/Cu/InSnAg, and MoTi/Cu/InSnAg.

The first circuit board 300 may be disposed on the third connection pad CP3. The first lead signal line LE1 may be disposed on the first circuit board 300 contacting the third connection pad CP3. The first lead signal line LE1 may be formed on the base film 310. The first lead signal line LE1 may be electrically connected to the driving integrated circuit 390 by the first signal line L1. The driving integrated circuit 390 may be electrically connected to the second lead signal line LE2 by the second signal line L2.

Panel pads PAD and connection pads CP may be disposed on the panel pad area P_PA. The panel pads PAD may have a shape extending in the second direction DR2 and may be arranged along the first direction DR1. The connection pads CP may be arranged on the side surface of the display panel 100. The connection pads CP may be formed by forming a metal film on the side surface of the display panel 100 and patterning the metal film.

The connection pads CP may have a shape extending in the third direction DR3, and may be arranged one-to-one corresponding to each of the panel pads PAD. Accordingly, the number of connection pads CP may be the same as the number of panel pads PAD, but the invention is not limited thereto. The connection pad CP may be disposed to cover another side surface of each panel pad PAD in the second direction DR2. The width of the connection pad CP in the first direction DR1 may be greater than or equal to the width of the panel pad PAD in the first direction DR1. The width of the connection pad CP in the third direction DR3 may be greater than the width of the panel pad PAD in the third direction DR3.

The width of the connection pad CP in the third direction DR3 may be smaller than the width of the display panel 100 in the third direction DR3. The edge of a surface of the connection pad CP contacting the side surface of the display panel 100 may be disposed inside the side surface of the display panel 100.

The shapes of the panel pad PAD and the connection pad CP described above are not limited thereto, and the panel pad PAD and the connection pad CP may have various shapes.

First lead signal lines LE1 may be disposed in the first circuit area CA1 of the first circuit board 300. The first lead signal line LE1 may be a portion where bonding is substantially performed when the first circuit board 300 is attached to the panel pad area P_PA of the display panel 100. Specifically, bonding may be performed while a part of the first lead signal line LE1 contacting the third connection pad CP3 and a part of the third connection pad CP3 contacting the first lead signal line LE1 are melted by ultrasonic waves and then undergo solidification. The first lead signal lines LE1 may have a shape extending in the third direction DR3, and may be arranged along the first direction DR1. The shape of the first lead signal line LE1 may be substantially the same as the shape of the above-described connection pad CP, but is not limited thereto, and may have a different shape from the connection pad CP.

Figure 6:
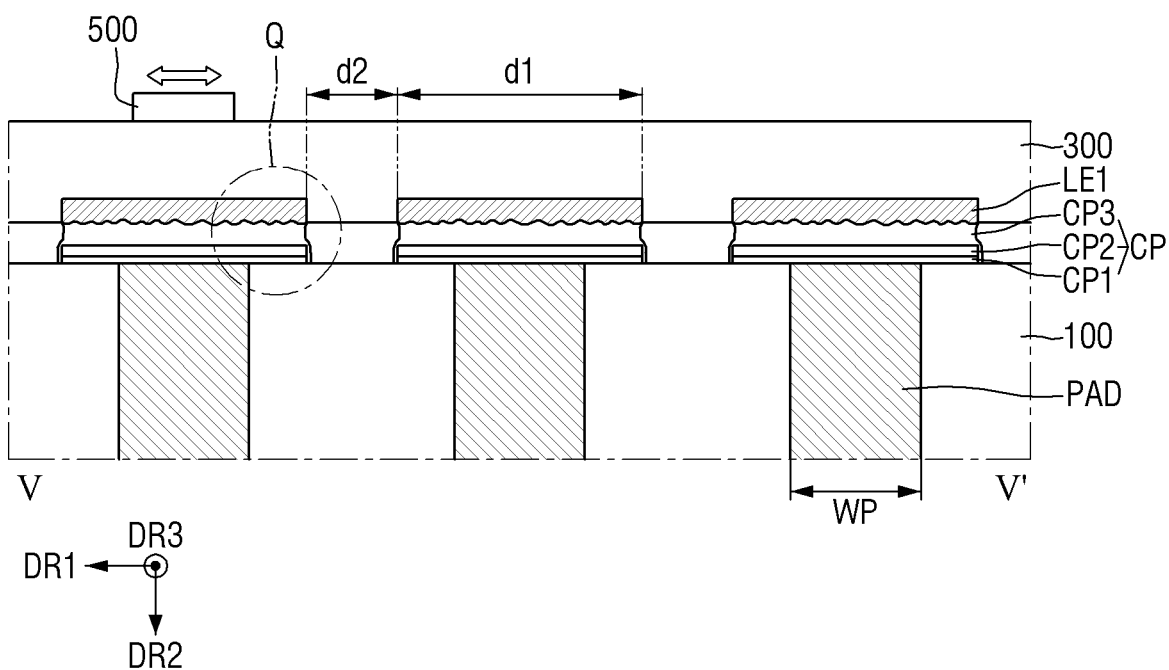
FIG. 6 is a schematic cross-sectional view of the display device taken along line V-V' of FIG. 5.
Figure 7:
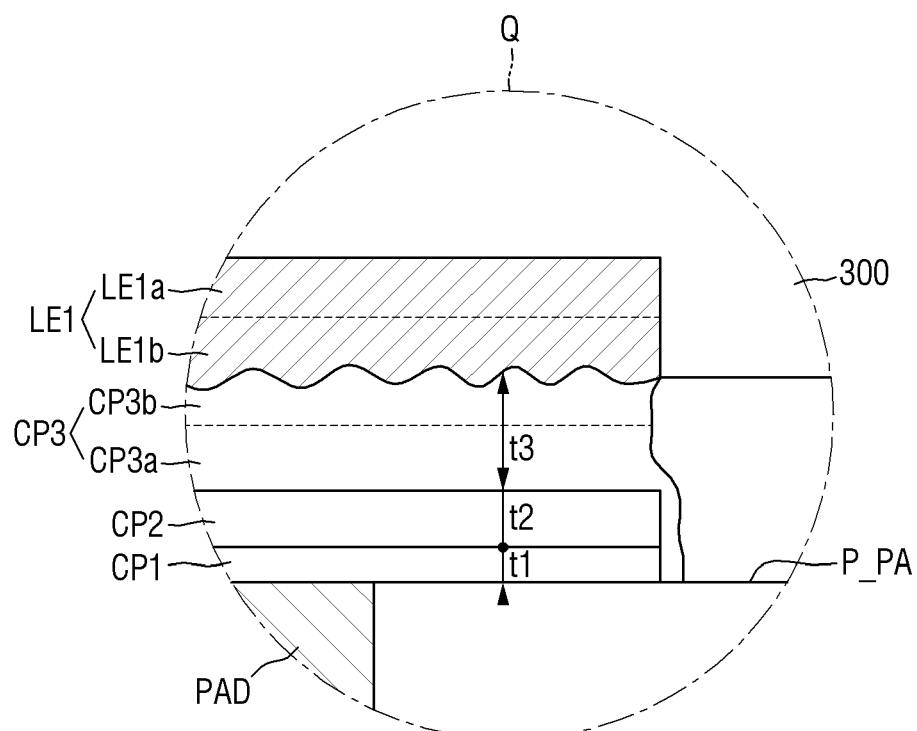
FIG. 7 is an enlarged schematic view of area Q in FIG. 6.
Figure 8:
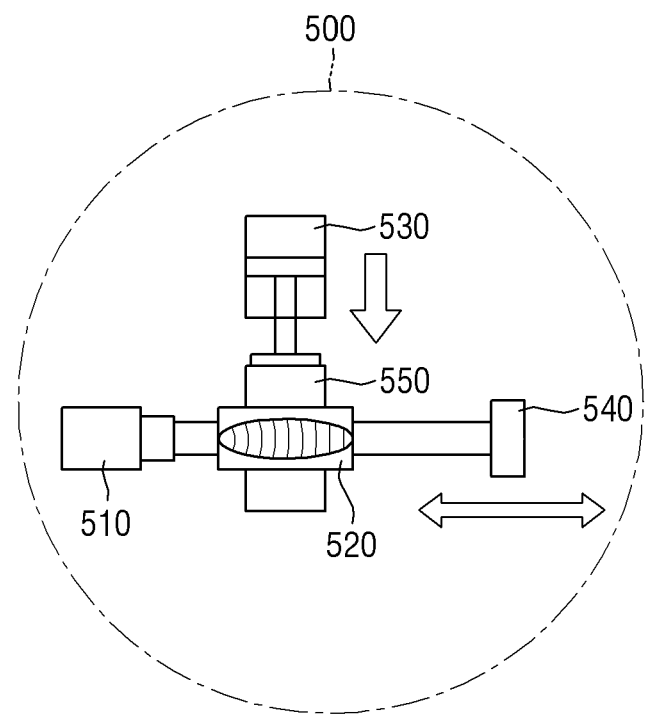
FIG. 8 is a schematic view of an ultrasonic bonding apparatus according to an embodiment.

FIG. 6 is a schematic cross-sectional view of the display device taken along line V-V' of FIG. 5, FIG. 7 is an enlarged schematic view of area Q in FIG. 6, and FIG. 8 is a schematic view of an ultrasonic bonding apparatus according to an embodiment.

Referring to FIGS. 6 and 8, the connection pad CP and the first lead signal line LE1 may overlap each other in the second direction DR2.

The first circuit board 300 may be attached to the panel pad area P_PA of the display panel 100 through ultrasonic bonding using an ultrasonic bonding apparatus 500. The ultrasonic bonding apparatus 500 may include a vibration generator 510, a vibration part 520 connected to the vibration generator 510, a pressing part 530 for amplifying the vibration width of the vibration part 520, and a vibration transmitter 540 connected to the vibration part 520.

The vibration generator 510 may convert electrical energy into vibration energy. The vibration part 520 may vibrate with vibration energy converted by the vibration generator 510. The vibration part 520 may vibrate with a predetermined vibration direction and a predetermined amplitude. The vibration part 520 may amplify the amplitude in a direction parallel to the vibration direction through the pressing part 530 connected to the vibration part 520. The vibration transmitter 540 may transmit vibration of the vibration part 520 to an ultrasonic bonding object. The ultrasonic bonding apparatus 500 may further include a support 550, and the support 550 may fix the upper and lower surfaces of the vibration part 520 to prevent the vibration part 520 and the vibration transmitter 540 from being moved upward and downward by the vibration.

In an embodiment, the ultrasonic bonding apparatus 500 may contact another side surface of the first circuit board 300 in the second direction DR2 and maintain a constant pressing state toward a side of the first circuit board 300 in the second direction DR2 to allow the vibration transmitter 540 to efficiently transmit vibration to the first circuit board 300. At this time, the vibration transmitter 540 of the ultrasonic bonding apparatus 500 may perform ultrasonic bonding while overlapping the underlying first circuit board 300 in the thickness direction.

The ultrasonic bonding apparatus may vibrate the first lead signal lines LE1 in a predetermined vibration direction while vibrating in the vibration direction. However, the connection pads CP may vibrate slightly in the vibration direction due to vibrations transmitted through each of the first lead signal lines LE1, but the vibration width may be negligible. Therefore, it may be seen that the vibration width of the vibration transmitter 540 in the vibration direction may be substantially equal to the distance that the first lead signal lines LE1 have moved in the vibration direction on the connection pads CP. In an embodiment, the vibration direction may be the first direction DR1 or the third direction DR3. For example, the vibration direction may be a direction perpendicular to the thickness direction of the first lead signal line LE1 and each of the connection pads CP, but the invention is not limited thereto.

When the first circuit board 300 may be ultrasonically vibrated on a surface of the connection pad CP, a predetermined frictional force may be generated at an interface between a surface of the connection pad CP and a surface of the first lead signal line LE1, and thus frictional heat may be generated. Specifically, frictional heat may be generated at an interface between a surface of the third connection pad CP3 and a surface of the first lead signal line LE1 contacting a surface of the third connection pad CP3. When the frictional heat may be sufficient to melt the material constituting the third connection pad CP3 and the first lead signal line LE1, a pad melting area CP3b of the third connection pad CP3 adjacent to the first lead signal line LE1 and a lead melting area LE1b of the first lead signal line LE1 adjacent to the third connection pad CP3 may be melted. For example, the third connection pad CP3 may include a pad non-melting area CP3a and a pad melting area CP3b. Further, the first lead signal line LE1 may include a lead non-melting area LE1a and a lead melting area LE1b.

The pad non-melting area CP3a may be an area including only the material included in the third connection pad CP3. The lead non-melting area LE1a may be an area including only the material included in the first lead signal line LE1.

In the pad melting area CP3b and the lead melting area LE1b, the third connection pad CP3 and the first lead signal wire LE1 may be combined with each other while solidifying.

The interface between the third connection pad CP3 and the first lead signal line LE1 may have a shape. For example, the interface between the pad melting area CP3b and the lead melting area LE1b may have a non-flat uneven shape.

As described above, the ultrasonic bonding between the panel pad area P_PA on the side surface of the display panel 100 and the first circuit board 300 may be performed between the first lead signal line LE1 and the third connection pad CP3 disposed in the panel pad area P_PA overlapping the first lead signal line LE1. During the ultrasonic bonding, the ultrasonic bonding apparatus 500 may vibrate the first circuit board 300 along a direction while pressing the first circuit board 300.

As described above, in an embodiment, the third connection pad CP3 may be made of a material having a low melting point. Therefore, a part of the third connection pad CP3 may be reflowed during an ultrasonic bonding process or a laser patterning process to be described later. As shown in FIG. 7, the third connection pad CP3 may be reflowed by ultrasonic waves of an ultrasonic bonding process or a laser of a laser patterning process, so that a part of the third connection pad CP3 may flow to the side surfaces of the first and second connection pads CP1 and CP2, and another part thereof may flow onto the panel pad area P_PA. The width of the connection pad CP and the interval between neighboring connection pads CP may be set to suppress the occurrence of shorts that may occur due to the reflow of the third connection pad CP3.

In an embodiment, the width of the second connection pad CP2 in the first direction DR1 may be defined as a first distance d1, and the interval from an edge of a second connection pad CP2 in the first direction DR1 to another edge of another second connection pad CP2 adjacent to a side of the second connection pad CP2 in the first direction DR1 may be defined as a second distance d2 (or pad space). For example, the second distance d2 may refer to an interval between the second connection pads CP2. The first distance d1 and the second distance d2 (or pad space) may have uniform values for each area.

The second distance d2 (or pad space) may be smaller than the first distance d1. For example, the first distance d1 may be about 10 μm to about 30 μm, or about 15 μm to about 25 μm, but is not limited thereto. The second distance d2 (or pad space) may be about 3 μm to about 9 μm, or about 4 μm to about 8 μm, but is not limited thereto.

The first thickness t1 defined as the thickness of the first connection pad CP1 may be about 100 nm or less, about 80 nm or less, or about 50 nm or less, but is not limited thereto. The second thickness t2 defined as the thickness of the second connection pad CP2 may be about 100 nm to about 500 nm, about 200 nm to about 400 nm, or about 250 nm to about 350 nm, but is not limited thereto.

For example, the third thickness t3 defined by the thickness of the third connection pad CP3 may be about 1 μm or more, because voids in the connection pad CP may be suppressed to the ultrasonic bonding strength between the display panel 100 and the first circuit board 300, and the peeling issue due to the thickness may be minimized. The third thickness t3 may be about 1 μm or more, about 1.5 μm or more, or about 2 μm or more, but is not limited thereto. For example, the third thickness t3 may be less than or equal to half of the second distance d2 (or pad space) in order to minimize the occurrence of shorts between adjacent connection pads CP due to the reflow of the third connection pad CP3. However, the connection pad CP may have a patterning alignment tolerance. In case that there is a patterning alignment tolerance, the third thickness t3 may be less than or equal to half of a value obtained by subtracting the patterning alignment tolerance from the second distance d2 (or pad space). For example, in case that the second distance d2 (or pad space) may be about 6 μm, the third thickness t3 may be less than or equal to about 3 μm.

According to the display device 1 according to an embodiment, when ultrasonically bonding the first circuit board 300 to the side surface of the display panel 100, a predetermined distance between the connection pads CP may be secured, and a low-melting metal may be used for the third connection pads CP3, thereby improving the reliability of ultrasonic bonding.

Figure 9:
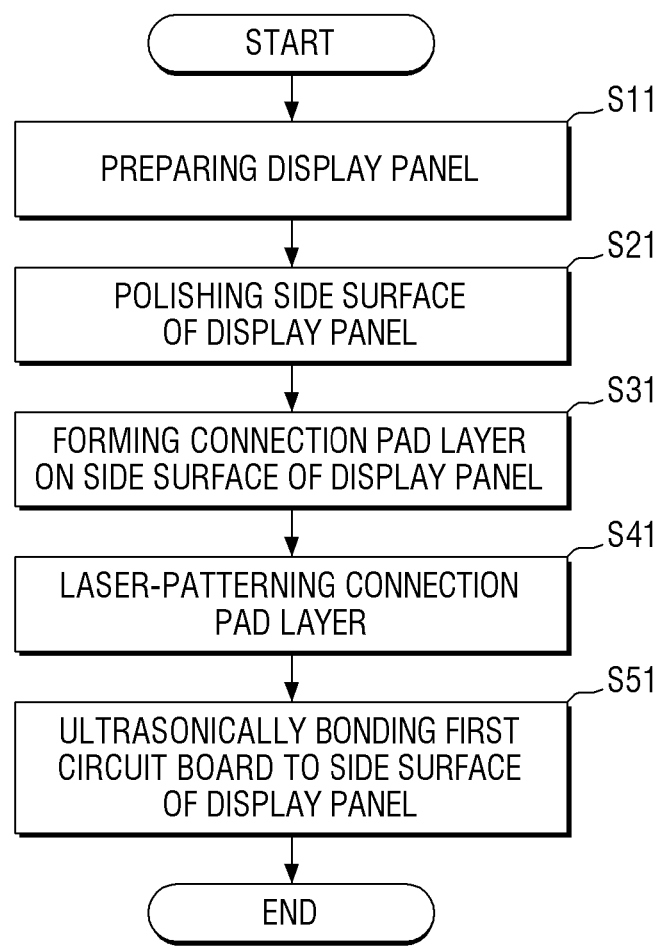
FIG. 9 is a flowchart illustrating a method of manufacturing a display device according to an embodiment.

FIG. 9 is a schematic flowchart illustrating a method of manufacturing a display device according to an embodiment, and FIGS. 10 to 13 are schematic views illustrating the method of manufacturing a display device according to the flowchart of FIG. 9.

Referring to FIGS. 9 to 13, a method of manufacturing a display device according to an embodiment may include the steps of: (S11) preparing a display panel; (S21) polishing a side surface of the display panel; (S31) forming a connection pad layer on the side surface of the display panel; (S41) laser-patterning the connection pad layer; and (S51) ultrasonically bonding a first circuit board to the side surface of the display panel.

Figure 10:
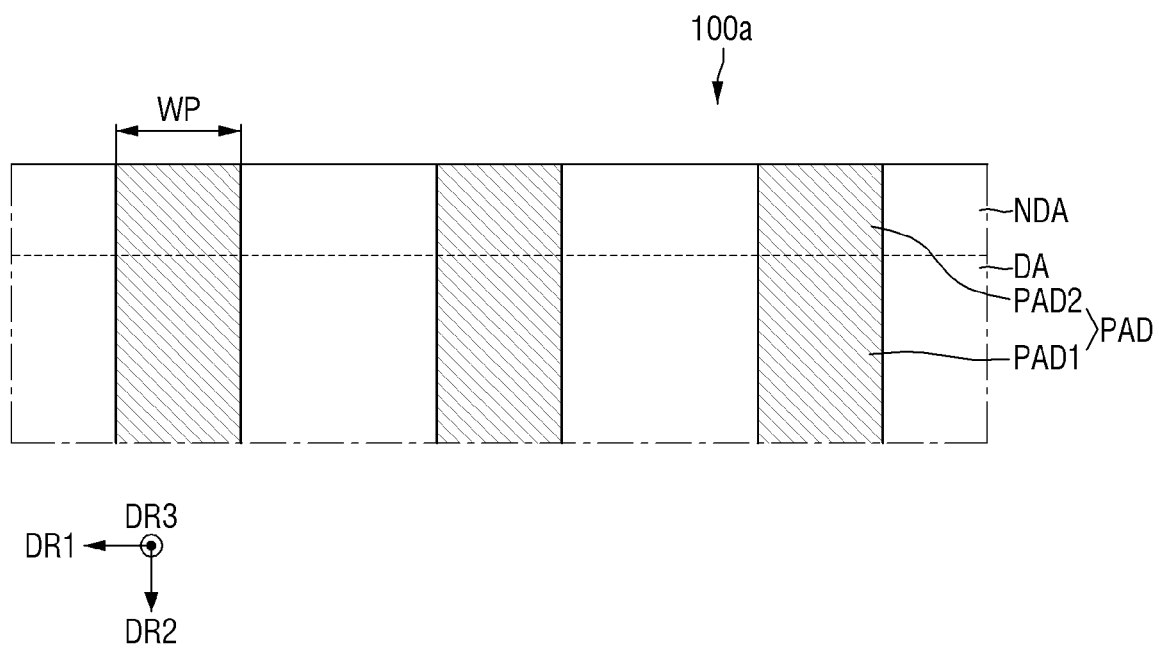
FIGS. 10 to 13 are schematic views illustrating the method of manufacturing a display device according to the flowchart of FIG. 9.
Figure 11:
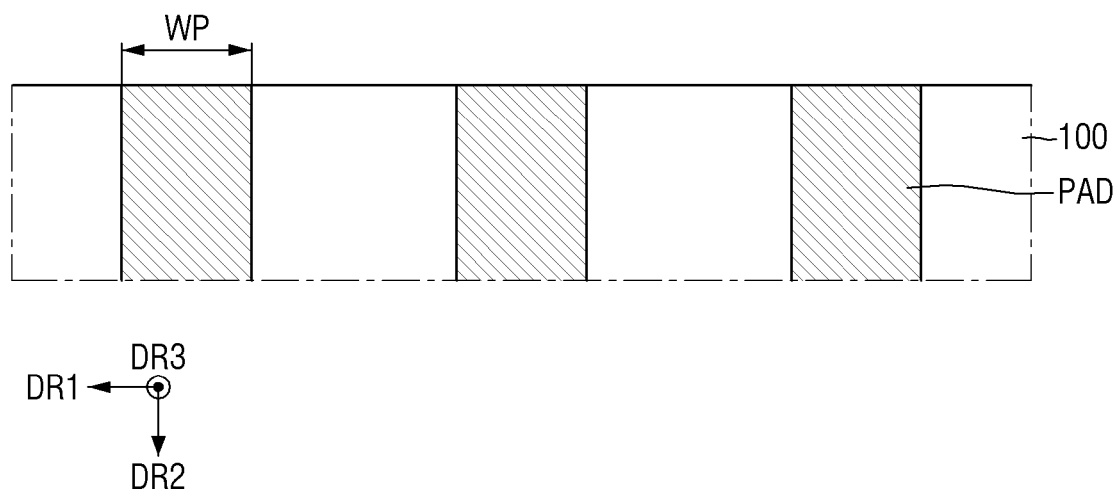
Figure 12:
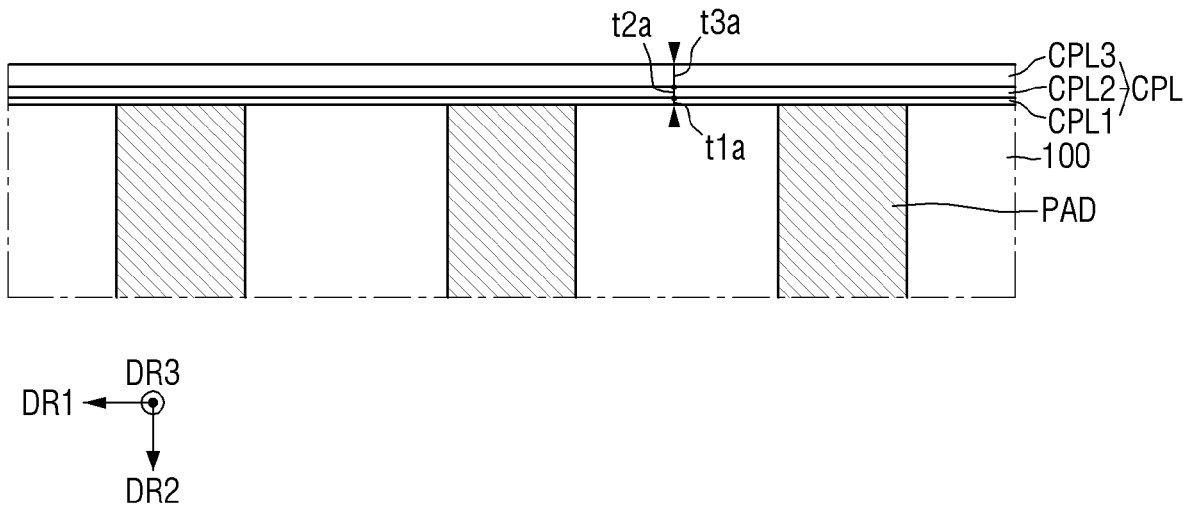
Figure 13:
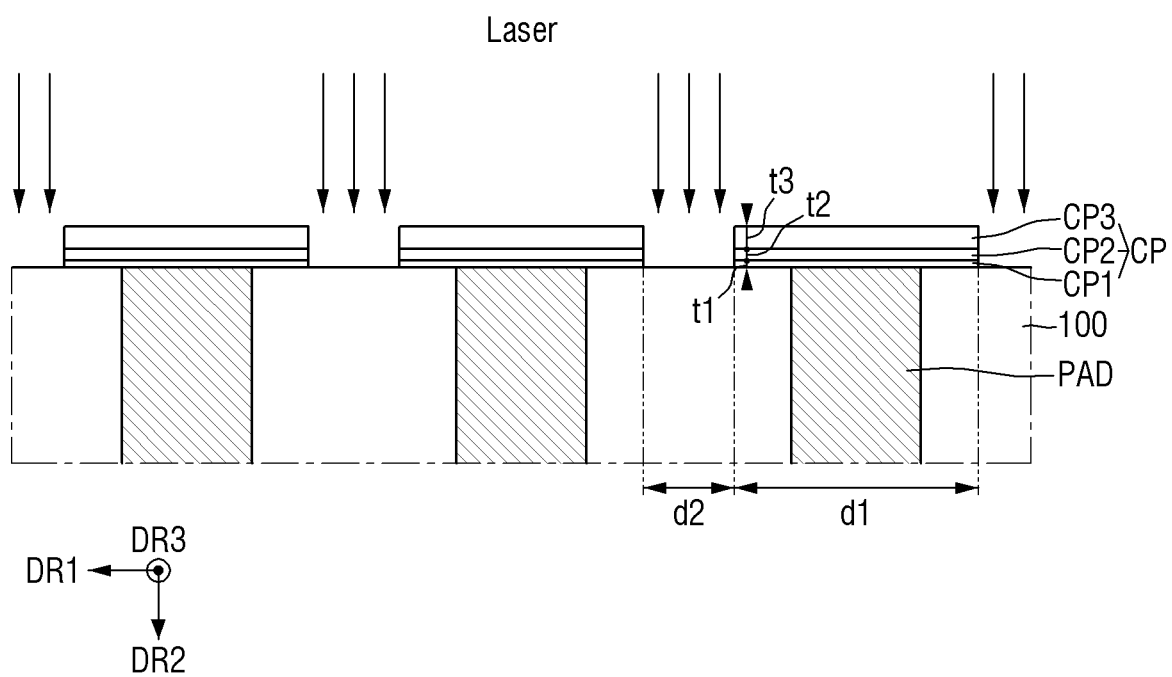

Referring to FIGS. 9 to 11, the method of manufacturing a display device according to an embodiment includes a step (S11) of preparing a display panel. The display panel 100a may include a panel pad PAD. The panel pad PAD may include a first portion PAD1 disposed in the display area DA and a second portion PAD2 disposed in the non-display area NDA.

After the step (S11) of preparing the display panel, a step (S21) of polishing a side surface of the display panel may be performed. A part of the non-display area NDA in which the second portion PAD2 of the panel pad PAD of the display panel 100a is disposed may be removed by polishing. The display panel 100a may be polished through mechanical polishing using a polishing apparatus (not shown), but is not limited thereto. The display panel 100 from which a part of the non-display area NDA is removed may include the first portion PAD1 of the panel pad PAD.

Referring to FIGS. 9 to 12, after the step (S21) of polishing a side surface of the display panel, a step (S31) of forming a connection pad layer on the side surface of the display panel may be performed. A connection pad layer CPL may be formed on a side of the display panel 100 to which the panel pad PAD is exposed. The connection pad layer CPL may include a first connection pad layer CPL1 forming a first connection pad CP1 through a laser patterning process to be described later, a second connection pad layer CPL2 forming a second connection pad CP2 through the laser patterning process, and a third connection pad layer CPL3 forming the third connection pad CP3 through the laser patterning process. The process of forming the connection pad layer CPL may be performed through sputtering using a sputter, but the invention is not limited thereto, and the connection pad layer CPL may be formed by other methods. In the order of forming the connection pad layer CPL on a side surface of the display panel 100, the first connection pad layer CPL1 may be formed on a side of the display panel 100, the second connection pad layer CPL2 may be formed on the first connection pad layer CPL1, and the third connection pad layer CPL3 may be formed on the second connection pad layer CPL2.

The thickness t1a of the first connection pad layer CPL1 may be equal to the first thickness t1 of the first connection pad CP1. The thickness t2a of the second connection pad layer CPL2 may be equal to the second thickness t2 of the second connection pad CP2. However, the third connection pad layer CPL3 may be partially melted by a subsequent laser patterning process or ultrasonic bonding process and flow to the side surface thereof to form the third connection pad CP3. Accordingly, the thickness t3a of the third connection pad layer CPL3 may be greater than the third thickness t3 of the third connection pad CP3, but the invention is not limited thereto, and the thickness t3a of the third connection pad layer CPL3 may be equal to the third thickness t3 of the third connection pad CP3 when the amount of melting is very small.

The thickness t1a of the first connection pad layer CPL1 may be about 100 nm or less, about 80 nm or less, or about 50 nm or less, but is not limited thereto. The thickness t2a of the second connection pad layer CPL2 may be about 100 nm to 500 nm, about 200 nm to 400 nm, or about 250 nm to 350 nm, but is not limited thereto. The thickness t3a of the third connection pad layer CPL3 may be about 1 μm or more, about 1.5 μm or more, or about 2 μm or more, but is not limited thereto.

Referring to FIGS. 9 to 13, after the step (S31) of forming the connection pad layer on a side surface of the display panel, a step (S41) of laser-patterning the connection pad layer may be performed. The first to third connection pad layers CPL1, CPL2, and CPL3 may be formed into first to third connection pads CP1, CP2, and CP3, respectively, through a laser patterning process. The laser patterning process, which may be a method of thermally processing a material by converting energy of a laser beam into heat and using the heat, may be a patterning method of forming a desired pattern by imprinting or discoloring the surface of a workpiece using a high energy density of a laser beam. The laser patterning processes may be classified into a mask-type laser patterning process in which a mask is placed between a workpiece and a laser light source to form a pattern only under the mask, and a scan-type laser patterning process in which a laser beam is scanned only at the marking position of a workpiece to form a pattern having a desired shape.

The second connection pads CP2 having undergone the laser patterning process each have a constant width (first distance d1) and a constant distance (second distance d2) (or pad space) between the neighboring second connection pads CP2. The first distance d1 that is a width of each second connection pad CP2 may be equal to the width of each panel pad PAD, but the invention is not limited thereto.

Referring to FIGS. 6, 8, and 9, after the step (S41) of laser-patterning the connection pad layer, a step (S51) of ultrasonically bonding a first circuit board to a side surface of the display panel may be performed. The ultrasonic bonding may be performed using the ultrasonic bonding apparatus 500. Since the detailed ultrasonic bonding process has been described above with reference to FIGS. 6 to 8, detailed repetition will be omitted.

Figure 14:
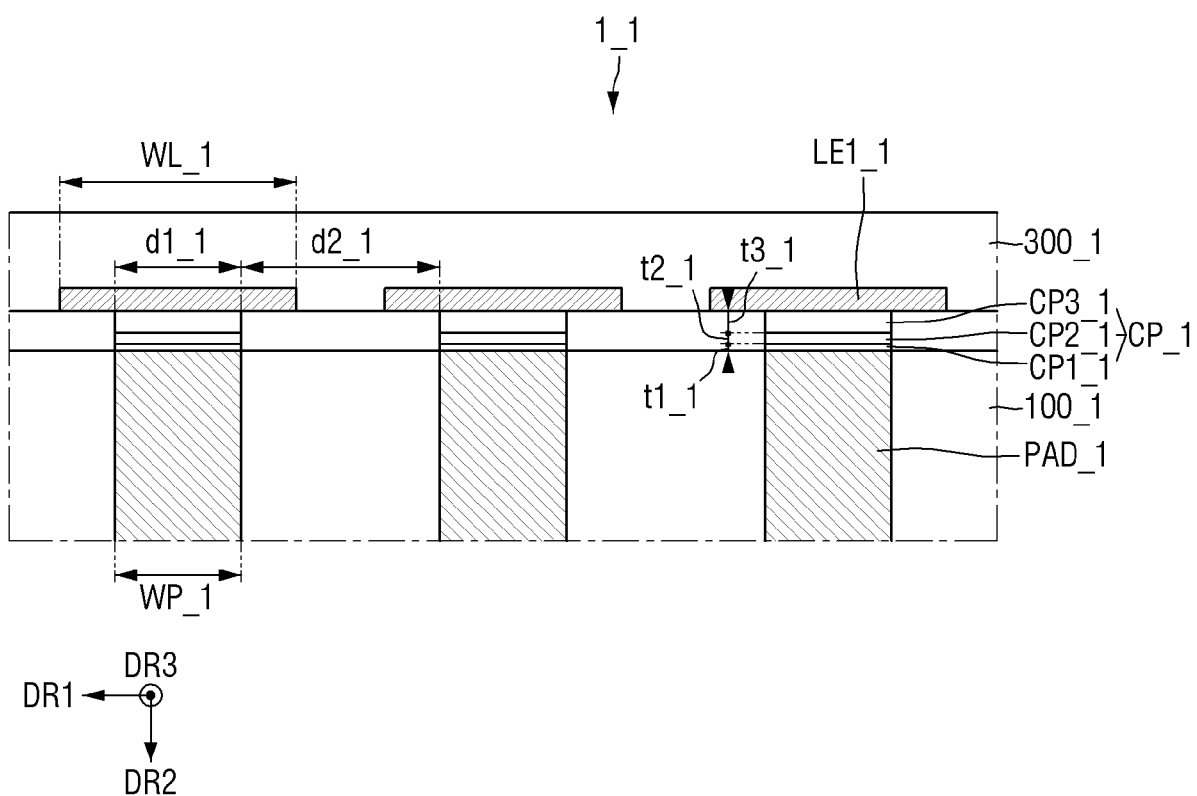
FIG. 14 is a schematic cross-sectional view of a pad area of a display device according to another embodiment.

FIG. 14 is a schematic cross-sectional view of a pad area of a display device according to another embodiment.

Referring to FIG. 14, in the display device 1_1 according to the embodiment, the width (first distance d1_1) of each second connection pad CP2_1 may be equal to the width WP_1 of the panel pad PAD_1. For example, both edges of each connection pad CP_1 may be aligned with both edges of each panel pad PAD_1. Each of the width (first distance d1_1) of each second connection pad CP2_1 and the width WP_1 of each panel pad PAD_1 may be smaller than the width WL_1 of the first lead signal line LE1_1.

Even in this case, for example, the third thickness t3_1 defined by the thickness of the third connection pad CP3_1 may be about 1 μm or more, because voids in the connection pad CP_1 may be suppressed to the ultrasonic bonding strength between the display panel 100_1 and the first circuit board 300_1. The third thickness t3_1 may be about 1 μm or more, about 1.5 μm or more, or about 2 μm or more, but is not limited thereto. The third thickness t3_1 may be less than or equal to half of the second distance d2_1 (or pad space) defined as an interval from an edge of a second connection pad CP2_1 in the first direction DR1 to another edge of another second connection pad CP2_1 adjacent to a side of the second connection pad CP2_1 in the first direction DR1. However, the second connection pad CP2_1 may have a patterning alignment tolerance. In case that there is a patterning alignment tolerance, the third thickness t3_1 may be less than or equal to half of a value obtained by subtracting the patterning alignment tolerance from the second distance d2_1 (or pad space).

According to the display device 1_1 according to another embodiment, when ultrasonically bonding the first circuit board 300_1 to the side surface of the display panel 100_1, a predetermined distance between the connection pads CP_1 may be secured, and a low-melting metal may be used for the third connection pads CP3_1, thereby improving the reliability of ultrasonic bonding.

Since other contents may be the same as or similar to those described above with reference to FIGS. 1 to 8, and additional detailed description thereof will be omitted.

Figure 15:
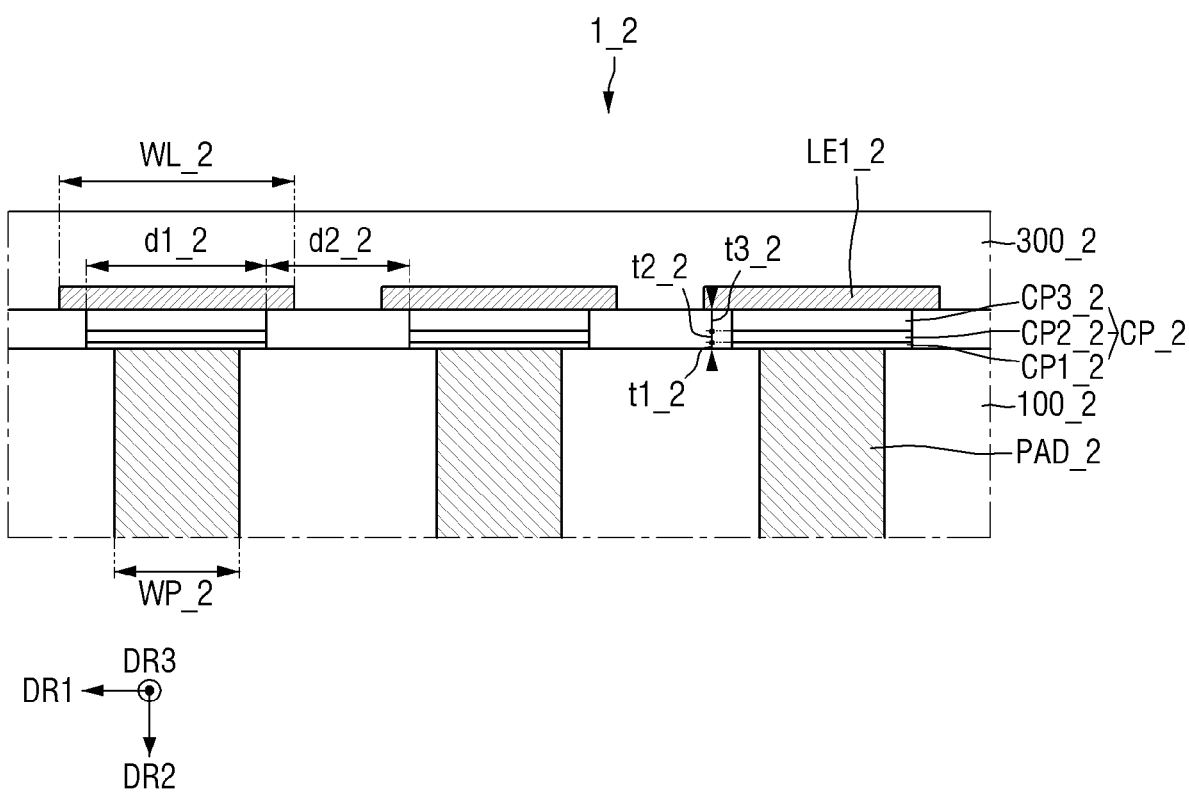
FIG. 15 is a schematic cross-sectional view of a pad area of a display device according to another embodiment.

FIG. 15 is a schematic cross-sectional view of a pad area of a display device according to another embodiment.

Referring to FIG. 15, in the display device 1_2 according to the embodiment, the width (first distance d1_2) of each second connection pad CP2_2 may be greater than the width WP_2 of the panel pad PAD_2 and may be smaller than the width WL_2 of the first lead signal line LE1_2. Both edges of each connection pad CP_2 may be disposed inside both edges of the first lead signal line LE1_2, and may be disposed outside both edges of the panel pad PAD_2.

Even in this case, for example, the third thickness t3_2 defined by the thickness of the third connection pad CP3_2 may be about 1 μm or more, because voids in the connection pad CP_2 may be suppressed to the ultrasonic bonding strength between the display panel 100_2 and the first circuit board 300_2. The third thickness t3_2 may be about 1 μm or more, about 1.5 μm or more, or about 2 μm or more, but is not limited thereto. The third thickness t3_2 may be less than or equal to half of the second distance d2_2 (or pad space) defined as an interval from an edge of a second connection pad CP2_2 in the first direction DR1 to another edge of another second connection pad CP2_2 adjacent to a side of the second connection pad CP2_2 in the first direction DR1. However, the second connection pad CP2_2 may have a patterning alignment tolerance. In case that there may be a patterning alignment tolerance, the third thickness t3_2 may be less than or equal to half of a value obtained by subtracting the patterning alignment tolerance from the second distance d2_2 (or pad space).

According to the display device 1_2 according to another embodiment, when ultrasonically bonding the first circuit board 300_2 to the side surface of the display panel 100_2, a predetermined distance between the connection pads CP_2 may be secured, and a low-melting metal may be used for the third connection pads CP3_2, thereby improving the reliability of ultrasonic bonding.

Figure 16:
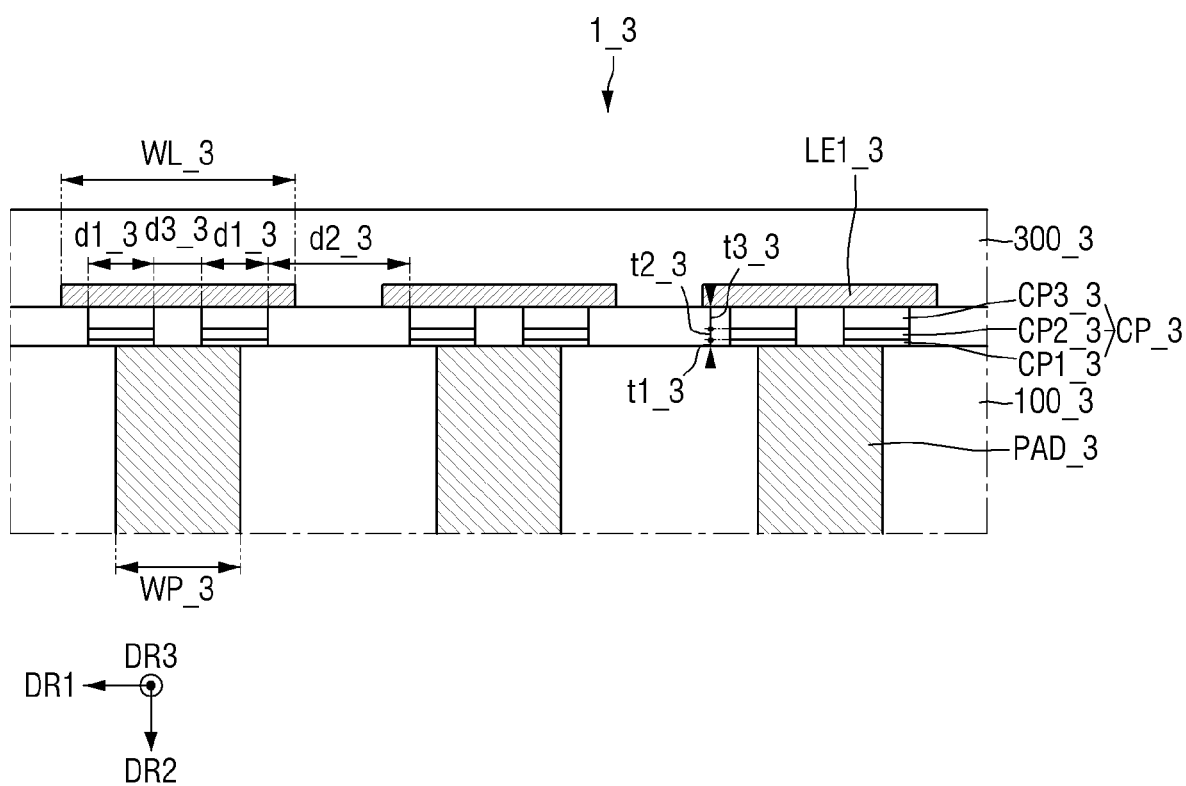
FIG. 16 is a schematic cross-sectional view of a pad area of a display device according to another embodiment.

FIG. 16 is a schematic cross-sectional view of a pad area of a display device according to another embodiment.

Referring to FIG. 16, in the display device 1_3 according to the embodiment, connection pads CP_3 separated from each other by a third distance d3_3 may be disposed between the panel pad PAD_3 and the first lead signal line LE1_3 coupled thereto. Although it is illustrated in the embodiment that two connection pads CP_3 may be disposed between the panel pad PAD_3 and the first lead signal line LE1_3 coupled thereto, the invention is not limited thereto, and a larger number of connection pads CP_3 may be arranged. The width of a second connection pad CP2_3 may be defined as a first distance d1_3. The interval between an edge of the second connection pad CP2_3 disposed in a group including the panel pad PAD_3 and the first lead signal line LE1_3 coupled thereto and another edge of the second connection pad CP2_3 disposed in another group adjacent to the group in a direction may be defined as a second distance d2_3 (or pad space).

Even in this case, for example, the third thickness t3_3 defined by the thickness of the third connection pad CP3_3 may be about 1 μm or more, because voids in the connection pad CP_3 may be suppressed to the ultrasonic bonding strength between the display panel 100_3 and the first circuit board 300_3. The third thickness t3_3 may be about 1 μm or more, about 1.5 μm or more, or about 2 μm or more, but is not limited thereto. The third thickness t3_3 may be less than or equal to half of the second distance d2_3 (or pad space) defined as an interval from an edge of a second connection pad CP2_3 in the first direction DR1 to another edge of another second connection pad CP2_3 adjacent to a side of the second connection pad CP2_3 in the first direction DR1. However, the second connection pad CP2_3 may have a patterning alignment tolerance. In case that there may be a patterning alignment tolerance, the third thickness t3_3 may be less than or equal to half of a value obtained by subtracting the patterning alignment tolerance from the second distance d2_3 (or pad space). Since third distance d3_3 may be an interval between the connection pads CP_3 connecting the panel pad PAD_3 of a group to the first lead signal line LE1_3, the third distance d3_3 may be smaller than the second distance d2_3 (or pad space).

According to the display device 1_3 according to another embodiment, when ultrasonically bonding the first circuit board 300_3 to the side surface of the display panel 100_3, a predetermined distance between the connection pads CP_3 may be secured, and a low-melting metal may be used for the third connection pads CP3_3, thereby improving the reliability of ultrasonic bonding.

According to a display device of an embodiment, a bezel of the display device may be effectively reduced by attaching a driving circuit board to the side surface of a display panel through ultrasonic bonding.

According to a display device according to embodiments, when the driving circuit board is ultrasonically bonded to the side surface of the display panel, the bonding reliability of the ultrasonic bonding may be improved by using a low-melting metal.

The effects of the invention are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims, including any equivalents.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device, comprising:
   a display panel including panel pads adjacent to a side surface of the display panel;
   connection pads disposed on the side surface of the display panel and connected to the panel pads; and
   a circuit board disposed on the side surface of the display panel, the circuit board including lead signal lines directly bonded to the connection pads, wherein
   the connection pads include:
      a first connection pad;
      a second connection pad disposed on the first connection pad; and
      a third connection pad disposed on the second connection pad,
   the first connection pad is in contact with corresponding one of the panel pads, and
   the third connection pad is directly bonded to corresponding one of the lead signal lines.

2. The display device of claim 1, wherein the third connection pad is ultrasonically bonded to the corresponding one of the lead signal lines.

3. The display device of claim 2, wherein an interface between the third connection pad and the corresponding one of the lead signal lines has a non-flat shape.

4. The display device of claim 1, wherein a melting point of the third connection pad is lower than a melting point of the second connection pad and a melting point of the first connection pad.

5. The display device of claim 4, wherein the melting point of the third connection pad is about 270° C. or lower.

6. The display device of claim 1, wherein the third connection pad has a thickness smaller than or equal to a half of an interval between neighboring second connection pads.

7. The display device of claim 6, wherein the thickness of the third connection pad is equal to or greater than about 1 µm.

8. The display device of claim 1, wherein
   the display panel includes a substrate, and
   an end of the panel pad is aligned with a side surface of the substrate.

9. The display device of claim 8, wherein the connection pad protrudes outward from the side surface of the substrate.

10. A display device including a display area and a non-display area surrounding the display area, the display device comprising:
    a display panel including a pad area disposed on a side surface of the non-display area;
    a connection pad disposed on the pad area; and
    a circuit board disposed on the connection pad, wherein
    the display panel includes at least one panel pad adjacent to the pad area,
    the connection pad is connected to the at least one panel pad,
    the circuit board includes a lead signal line directly bonded to the connection pad,
    the connection pad includes:
       a first connection pad;
       a second connection pad disposed on the first connection pad; and
       a third connection pad disposed on the second connection pad,
    the first connection pad is in contact with the at least one panel pad, and
    the third connection pad is directly bonded to the lead signal line.

11. The display device of claim 10, wherein the connection pad is ultrasonically bonded to the lead signal line.

12. The display device of claim 11, wherein an interface between the connection pad and the lead signal line has a non-flat shape.

13. The display device of claim 10, wherein the connection pad includes a first material selected from nickel (Ni), chromium (Cr), copper (Cu), indium (In), tin (Sn), silver (Ag), titanium (Ti), molybdenum (Mo), or any combination thereof.

14. The display device of claim 13, wherein the first material includes at least one selected from NiCr/Cu/InSnAg, Ti/Cu/InSnAg, and MoTi/Cu/InSnAg.

15. The display device of claim 13, wherein the lead signal line includes a second material including Sn.

16. The display device of claim 15, wherein the first material and the second material are mixed in an area between the connection pad and the lead signal line.

17. The display device of claim 10, wherein a melting point of the third connection pad is lower than a melting point of the second connection pad and a melting point of the first connection pad.

18. The display device of claim 10, wherein the third connection pad has a thickness smaller than or equal to a half of an interval between neighboring second connection pads.

19. The display device of claim 10, wherein the display panel includes:
    a substrate;
    a first conductive layer on the substrate;
    a first insulating layer on the first conductive layer;
    a second conductive layer on the first insulating layer;
    a second insulating layer on the second conductive layer; and
    a third conductive layer on the second insulating layer, wherein the third conductive layer includes the at least one panel pad.

20. The display device of claim 19, wherein the connection pad protrudes outward from a side surface of the substrate.

* * * * *